United States Patent [19]

Pampalone et al.

[11] 4,398,660
[45] Aug. 16, 1983

[54] METHOD OF MOUNTING ELECTRONIC COMPONENTS

[75] Inventors: Thomas R. Pampalone, Belle Mead; Anthony Z. Miller, Flemington, both of N.J.

[73] Assignee: RCA Corporation, New York, N.Y.

[21] Appl. No.: 271,036

[22] Filed: Jun. 4, 1981

[51] Int. Cl.³ .......................... B23K 31/02; C09J 3/14
[52] U.S. Cl. .................................... 228/175; 29/840; 156/332; 228/180 A; 525/344
[58] Field of Search .......................... 228/175, 180 A; 156/332; 29/840; 427/341; 264/83; 525/344

[56] References Cited

U.S. PATENT DOCUMENTS

| | | | |
|---|---|---|---|
| 4,017,652 | 4/1977 | Gruber | 427/54 |
| 4,020,256 | 4/1977 | Zweigle et al. | 526/88 |
| 4,098,977 | 7/1978 | Zweigle et al. | 526/77 |
| 4,107,156 | 8/1978 | Sunamori et al. | 526/91 |
| 4,208,005 | 6/1980 | Nate et al. | 427/96 X |

FOREIGN PATENT DOCUMENTS 16984 10/1980 European Pat. Off.
2904649 8/1979 Fed. Rep. of Germany

OTHER PUBLICATIONS

Ohsawa, *UHIC System Makes Sophisticated Products Possible,* Journal of Electrical Engineering, vol. 16, No. 150, pp. 50–53, Jun. 1979.

*Primary Examiner*—Evan K. Lawrence
*Attorney, Agent, or Firm*—Birgit E. Morris; R. Hain Swope

[57] ABSTRACT

An improved method for mounting leadless electronic components on printed circuit boards so they can be soldered in place is disclosed. The method utilizes an acrylate adhesive composition which is rapidly cured in two stages by treatment with gaseous sulfur dioxide followed by heat.

9 Claims, No Drawings

METHOD OF MOUNTING ELECTRONIC COMPONENTS

This invention relates to an improved method and adhesive composition for mounting electronic leadless components on a printed circuit board so that they may be thereafter soldered to form an electronic circuit.

BACKGROUND OF THE INVENTION

The trend in recent years in the electronics industry has been to replace conventional leaded systems with leadless components, e.g. chip capacitors, resistors, diodes and transistors. Such leadless components are attached to printed wiring boards, e.g. fiberglass/epoxy or paper/phenolic boards, in an automatic packaging system. Conventionally, the chips are adhered to the board and treated with solder flux. The board is then inverted and the electrodes of the chips wave soldered to the board at, e.g., 240° C. for six seconds.

The adhesive utilized to adhere the leadless components, i.e. chips, to circuit boards is particularly critical since the loss of a single chip per thousand cannot be tolerated. The adhesive must be highly reliable so that no chip will drop from the circuit board when it is inverted and wave soldered. In addition, the adhesive must conform readily so that the chip lays flat on the board, be solventless to minimize pollution, be easily dispensed for high speed operations, be long-lived and fast-acting.

Conventionally, chips are attached to circuit boards by heat curing or baking a small amount of adhesive, usually an epoxy resin, placed either on the board or the component before the latter is placed on the board. In present commercial operations, a substantial time, i.e. up to 20 minutes, in an oven may be required to effectively adhere leadless components to a printed circuit board. This baking step is disadvantageous for a number of reasons.

The baking step is an interruption of the manufacturing process and, in effect, negates high speed automated procedures which have been developed, for example, for accurately placing the chips on the boards. An extended heat cure may also cause the adhesive to flow and thin out under the chip. This reduces the effectiveness of the adhesive and may allow the chip to move from its position.

A recent improvement in adhering leadless components to circuit boards is a commercially available apparatus which permits an on-line, two-stage, i.e. ultraviolet light and heat, cure of an adhesive which is basically an acrylated epoxy resin. This apparatus effectively eliminates most of the problems inherent in the conventional heat cure because the partial cure affected by ultraviolet light acts to hold the chip in place, prevent adhesive flow and exclude oxygen which can adversely affect the subsequent thermal cure. A cure with ultraviolet light, however, is only effective where the light can reach and penetrate the resin. Therefore, fillers which would add strength to the adhesive and reduce costs cannot be utilized in conventionally effective amounts since, as most are opaque substances, such amounts would retard the penetration of ultraviolet light.

European Patent application No. 16,984 discloses an adhesive composition for mounting electronic components which is curable by ultraviolet light alone or in combination with subsequent heat curing. It is disclosed that it is essential that a portion of the adhesive composition extend beyond the chip so that ultraviolet light can strike it. It is stated that curing then takes place throughout the adhesive by a "chain-reaction".

SUMMARY OF THE INVENTION

In accordance with this invention, there is provided a method of mounting leadless electronic components to a printed circuit board utilizing a two-stage cure of an acrylate adhesive with gaseous sulfur dioxide and heat.

DETAILED DESCRIPTION OF THE INVENTION

The adhesive compositions utilized in mounting leadless electronic components on printed circuit boards in accordance with the present invention comprise one or more liquid monomers, each of which contains at least one acrylate moiety, a finely particulate inert filler, a free radical initiator having a hydroperoxide moiety, a conventional free radical thermal initiator and a suitable binder. The adhesive compositions, which are uniquely formulated for the curing method of this invention, are utilized to attach leadless components to a printed circuit board after which they are soldered in place.

As utilized in this invention, the term "acrylate moiety" means the chemical group represented by the formula

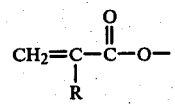

wherein R is hydrogen or methyl.

Representative examples of suitable monomers in accordance with this invention include acrylic acid, methacrylic acid, acrylates or methacrylates containing one or more acrylate moieties, such as alkyl acrylates, alkyl methacrylates, hexamethylenediol diacrylate or dimethacrylate, trimethylolpropane triacrylate or trimethacrylate, polypropyleneglycol tetraacrylate or tetramethacrylate, allyl acrylate or methacrylate, and the like. Acrylic and methacrylate esters which are suitable for the adhesive of this invention, are those recognized as being polymerizable in systems utilizing so-termed "redox reaction" free radicals. Preferred monomers in accordance with this invention are multifunctional acrylates or methacrylates, i.e. those containing more than one acrylate moiety. Particularly preferred monomers include trimethylolpropane triacrylate, trimethylolpropane trimethacrylate and hexamethylenediol diacrylate.

The monomer component of the adhesive compositions of this invention, which may be one or a number of monomers each containing one or more acrylate moieties, in general comprises from about 30 to about 80 percent by weight, preferably from about 50 to about 60 percent by weight, of the adhesive composition.

The adhesive compositions of this invention contain from about 5 to about 60 percent by weight, preferably from about 10 to about 50 percent by weight of a finely particulate, inert filler. Suitable fillers are non-conductive, inorganic materials such as, for example, alumina, carbon, titanium dioxide, glass, talc, silica and the like, with alumina being preferred. The presence of the filler in the adhesive compositions of this invention significantly reduces the cost of the adhesive and reduces the difference in thermal expansion of the adhesive so that it approximates that of the chips, thus acting to prevent dislodging of chips due to changes in temperature. The filler is likewise advantageous in that it improves the rheology of the adhesive for screen printing. Adhesive compositions utilized in this invention can contain a significantly high percentage of an opague filler without adversely affecting their effectiveness.

In order to facilitate the first stage of the two-stage on-line cure of this invention, the adhesive compositions contain an effective amount of a free radical initiator containing a hydroperoxide moiety. Suitable free radical initiators of this type include hydrogen peroxide or organic hydroperoxides, i.e., compounds containing one or more —OOH moieties. Examples of specific organic hydroperoxides suitable for use in the process of this invention include t-butylhydroperoxide, cumene hydroperoxide, 2,4-dimethyl-2,4-hexanedihydroperoxide and the like, with t-butylhydroperoxide being particularly preferred. It is to be noted that organic peroxides, i.e., compounds having the formula R—O—O—R' wherein both R and R' are organic radicals, are completely ineffective in the first stage of the curing of the adhesive compositions of this invention.

The amount of the hydroperoxide free radical initiator present in the adhesive compositions of this invention may vary within a rather wide range. Generally, however, the hydroperoxide free radical initiator is present in the subject adhesive compositions in from about 1 to about 10 percent by weight, preferably from about 4 to about 6 percent by weight.

In order to facilitate the second stage of the two-stage cure of this invention, the subject adhesive compositions contain a conventional free radical thermal initiator. Representative examples of this recognized group of compounds include diazo compounds, bisazide compounds and organic peroxides. The organic peroxides such as benzoyl peroxide, lauroyl peroxide and dicumyl peroxide are preferred, with benzoyl peroxide being particularly preferred. As in the instance of the hydroperoxide free radical initiator, the amount of thermal initiator in the adhesive compositions of this invention can vary within a rather wide range. Generally, however, the subject adhesive compositions will contain the thermal initiator in from about 0.1 to about 5 percent by weight, preferably from about 1 to about 3 percent by weight.

The adhesive compositions of this invention further contain a suitable polymeric binder which is soluble in the liquid monomer. Suitable binders include, for example, linear acrylate polymers, i.e. homopolymers or copolymers of monofunctional acrylates or methacrylates, novolac resins and the like. A particularly preferred binder in accordance with this invention is a poly(methyl methacrylate) copolymer marketed under the trademark Elvacite 2013 by E. I. duPont de Nemours & Co. The purpose of the binder is to adjust the viscosity of the adhesive composition and to provide flexibility and resiliency to the cured adhesive.

The amount of binder which can be present in the subject adhesive compositions is limited by its solubility in the liquid monomer. Generally, the adhesive compositions of this invention will contain from about 2 to about 50 percent by weight, preferably from about 20 to about 40 percent by weight of the binder.

The adhesive compositions of this invention may additionally contain other additives conventional in the art such as, for example, a pigment. The adhesive compositions of this invention may also contain a conventional chain transfer agent such as Michler's Ketone, i.e. 4,4'-bis-N,N-dimethylaminobenzophenone, to facilitate the degree and speed of polymerization. The presence and amounts of such agents would be predicated on conventional usage.

The adhesive compositions of this invention can be applied to printed circuit boards, or to the leadless components themselves, in any conventional manner. Because the first stage of the curing method of this invention is carried out with gaseous sulfur dioxide, it is not necessary that the subject adhesive compositions project from under the chips as is the case with adhesives cured with ultraviolet light. Therefore, the amount and placement of adhesive composition applied to the printed board can be precisely controlled. By proper adjustment of the viscosity of the subject adhesive compositions as discussed above, the adhesive can be readily dispensed from automated equipment. The components are temporarily attached to the board by placing them on the board and applying sufficient pressure to cause them to adhere to the board.

In accordance with this invention, the herein disclosed adhesive compositions are then cured to rigidly attach the leadless components to the board in two stages within a short period of time, i.e. usually within about two minutes. In the initial stage of the cure, the adhesive composition is exposed to gaseous sulfur dioxide under ambient conditions. This stage of the cure is complete in from about 1 to about 10 seconds, preferably about 5 seconds.

The first stage cure with gaseous sulfur dioxide, in practice, can be carried out by merely spraying the circuit boards with the chips in place with sulfur dioxide gas or by passing them through a semi-closed assembly containing sulfur dioxide gas. The first stage cure effected by the gaseous sulfur dioxide hardens a sufficient amount of the adhesive composition to hold the chip in place and prevent adhesive flow during the second stage heat cure. In addition, the sulfur dioxide cure prevents oxygen from coming in contact with the thermal initiator and reducing its effectiveness. Since the first stage of the cure utilizes a gas, the cure is effective under the chip and the adhesive composition need not project outwardly from the edges of the chip.

The second stage of the cure of this invention is a heat cure at from about 130° C. to 160° C., preferably about 150° C. An effective cure of the subject adhesive compositions can be carried out in about 1 minute. The chips are thereby effectively adhered to the printed circuit board so that they will not become dislodged during subsequent operations, particularly inversion of the boards and conventional wave soldering of the chips thereto. The rigidly attached components are then soldered to the circuit board.

The method of adhering leadless components to a printed circuit board in accordance with this invention has significant advantages over methodologies utilized heretofore in the electronics industry.

The curing method of this invention is sufficiently reliable to meet even the most stringent manufacturing specifications and sufficiently rapid to be readily carried out on-line in a manufacturing operation. This is a significant advantage in comparison to those prior art methods which require a separate baking step for an extended period of time.

The curing method of this invention is clearly advantageous in that it facilitates the rapid curing of adhesive compositions containing an amount of an opague filler which would prevent the passage of UV light. The economic and technological advantages of the use of such fillers in effective amounts in conventional adhesive compositions are well known to those skilled in the art.

The curing method of this invention is further advantageous in comparison to conventional heat curing since it effectively eliminates the problems of running and thinning out of the adhesive. The subject method is advantageous in comparison to ultraviolet light or ultraviolet light/heat curing since the use of a gas eliminates the requirement that the adhesive extend beyond the edges of the chip. Those skilled in the art will appreciate that, where an adhesive does not extend beyond all edges of a chip, short term ultraviolet curing will not be effective since the chip will prevent the light rays from contacting the adhesive. Therefore, the problems of flowing of the adhesive and oxygen inactivation of the thermal catalyst will not be eliminated where a partial cure has not taken place. Even an extended UV cure, which must rely on the "chain-reaction" phenomenon described in the above-mentioned European patent application to effect a total cure, would be most effective if the cure would be initiated simultaneously from all edges of the chip.

Lastly, the curing method of this invention has a number of significant practical advantages such as the amount of energy required, cost of equipment required, impact on the environment, adaptability to high speed on-line manufacturing techniques and the like.

The following examples further illustrate this invention, it being understood that the invention is in no way intended to be limited to the details described therein. In the examples, all parts and percentages are on a weight basis and all temperatures in degrees Centigrade, unless otherwise stated.

EXAMPLE 1

An adhesive composition was prepared by thoroughly mixing 0.5 g t-butylhydroperoxide, 0.5 g benzoyl peroxide, and 10 g of a 17.5 percent by weight solution of Elvacite 2013 a copolymer of methylmethacrylate available from E. I. duPont de Nemours Co., Inc. in trimethylolpropane triacrylate.

The adhesive was applied to circuit board material in a strip 5 mils thick and 40 mils wide. Conventional leadless components, i.e. chips, 126×63×24 mils, were pressed into the adhesive. The assembly was sprayed for 5 seconds with sulfur dioxide gas and then heated to 130° for one minute with an infrared heat lamp. The chip adhesive was found to be capable of withstanding a 950 g shear force and was considered effectively adhered to the board. The board was then fluxed and wave soldered with a liquid solder by conventional tecniques for 6 seconds at 240°.

EXAMPLE 2

An adhesive formulation containing a filler was prepared as follows: 0.5 g of t-butylhydroperoxide as an 80 percent solution in water and 0.1 g benzoyl peroxide were mixed with 10 g of a 33-⅓ percent solution of Elvacite 2013 in trimethylolpropane triacrylate. Ten grams of finely particulate alumina (G-30 alumina trihydrate, 65–80 mesh, supplied by Great Lakes Minerals Co.) was uniformly dispersed in the resulting solution. The adhesive formulation was applied in a strip 40 mils wide and 1 mil thick to an area of a circuit board where the copper had been previously removed by etching, thus rendering soldering ineffective. A total of 82 chips were placed onto the adhesive. The board was sprayed with sulfur dioxide gas for 5 seconds, then heated to 130° with an infrared lamp for 1 minute. The adhesion of the chips was sufficient to withstand 1000 g shear as measured with a dynamometer. The board was fluxed with a commercial flux material and then submerged into molten solder, i.e. a 60/40 mixture of tin and lead, for 6 seconds at 240°. The chips were again stress-tested and again withstood 1000 g shear force. The chips were considered effectively adhered to the board. The second stress test established that the soldering temperature did not degrade the adhesive, which would have caused the chips to drop from the board.

EXAMPLE 3

Adhesive formulations were prepared by individually mixing one part of an 80 percent aqueous solution of t-butylhydroperoxide, 0.1 part benzoyl peroxide and one part Linde B alumina with 10 parts of each of the following solutions of binder in liquid monomer. Linde B alumina is available from Union Carbide Corp. and has an average particle size of 0.5 micrometer.

| Solution | Binder | Percent Binder Concentration | Monomer |
|---|---|---|---|
| A | Acryloid-30* | 2 | Polypropyleneglycol tetraacrylate |
| B | Acryloid-30 | 3 | Trimethylolpropane triacrylate |
| C | Acryloid-30 | 10 | Hexamethylenediol diacrylate |
| D | Elvacite 2013 | 30 | Hexamethylenediol diacrylate |
| E | Elvacite 2013 | 30 | Trimethylolpropane triacrylate |
| F | Elvacite 2044** | 40 | Hexamethylenediol diacrylate |
| G | Alnovol 429K*** | 30 | Hexamethylenediol diacrylate |

*High molecular weight methyl methacrylate polymer available from Rohm & Haas, Inc.
**Poly(butyl methacrylate) - E. I. duPont de Nemours & Co.
***Novolac resin-American Hoechst Corp.

Each of the adhesive mixtures was applied to circuit boards treated to remove copper as in Example 2. Four chips were placed on each strip of adhesive. The boards were sprayed with gaseous sulfur dioxide for 5 seconds and then heated to 150° for one minute with an infrared lamp. Two of the chips on each adhesive were tested for maximum adhesion. The boards were then fluxed and submerged into molten solder as in Example 2. The remaining chips were then tested for maximum adhesion. The force required to remove the chips is given in the following Table.

TABLE

| Average Shear Force in Pounds Required to Remove Chip. | | |
|---|---|---|
| Solution | Before Solder | After Solder |
| A | 13 | 14 |
| B | 7.5 | 3.5 |
| C | >18 | >18 |
| D | >18 | α18 |
| E | 12 | 15 |
| F | 17 | >18 |
| G | 3 | 8 |

The results show that, although all chips adhered well to the board, the strength of the adhesive can be varied by selection of various combinations of binder and monomer.

COMPARATIVE EXAMPLE

In order to demonstrate that treatment with gaseous sulfur dioxide is essential for a maximum cure of the subject adhesive compositions, a sample of solution C of Example 3 was applied to a circuit board according to the procedure of Example 2. Four chips were placed on the adhesive and the board heated to 150° for one minute with an infrared lamp. The adhesive composition was observed to be tacky and uncured at the surface with extensive cracks and bubbles in the hardened portion below the surface. Adherence testing, according to the procedure of Example 3, showed the average force required to dislodge the chips before and after solder to be 9 and 11 pounds, respectively. More importantly, the fact that the surface of the adhesive remains tacky is unacceptable since the presence of unreacted monomer adversely effects the effectiveness of conventional flux compositions, particularly rosin fluxes which are widely used in the electronics industry.

We claim:

1. A method of mounting leadless electronic components on a printed circuit board comprising:
   (a) temporarily attaching said components to said board with an adhesive composition comprising:
      (1) 30 to 80% by weight of one or more liquid monomers each containing one or more acrylate moieties;
      (2) a finely particulate inert filler;
      (3) an effective amount of a free radical initiator containing a hydroperoxide moiety to allow partial curing of the adhesive composition upon exposure to gaseous sulfur dioxide;
      (4) an effective amount of a thermal initiator to allow complete curing of the adhesive composition upon exposure to heat; and
      (5) a polymeric binder soluble in said liquid monomers in an amount required to provide the desired flexibility and resiliency to the cured adhesive composition;
   (b) exposing the board to gaseous sulfur dioxide to partially cure said adhesive composition;
   (c) heating the board to complete the cure of said adhesive composition thereby rigidly attaching said components thereto; and
   (d) soldering said components to said board.

2. The method in accordance with claim 1, wherein, in step (b), the board is exposed to gaseous sulfur dioxide for from about 1 to about 10 seconds.

3. The method in accordance with claim 1, wherein, in step (c), the board is heated to a temperature of from about 130° C. to about 160° C. for about one minute.

4. The method in accordance with claim 1, wherein, the step (b), the board is exposed to gaseous sulfur dioxide for about 5 seconds and, in step (c), the board is heated to a temperature of about 150° C. for one minute.

5. The method in accordance with claim 1 wherein said free radical initiator is t-butylhydroperoxide and said thermal initiator is benzoyl peroxide.

6. The method in accordance with claim 1, wherein at least one of said liquid monomers contains more than one acrylate moiety.

7. The method in accordance with claim 6, wherein said liquid monomer containing more than one acrylate moiety is selected from the group consisting of trimethylolpropane triacrylate, trimethylolpropane trimethacrylate and hexamethylenediol diacrylate.

8. The method in accordance with claim 7, wherein said liquid monomer containing more than one acrylate moiety is hexamethylenediol diacrylate.

9. The method in accordance with claim 1, wherein said finely particulate inert filler is alumina.

* * * * *